(12) United States Patent
Morse et al.

(10) Patent No.: US 6,261,961 B1
(45) Date of Patent: Jul. 17, 2001

(54) ADHESION LAYER FOR ETCHING OF TRACKS IN NUCLEAR TRACKABLE MATERIALS

(75) Inventors: Jeffrey D. Morse, Martinez, CA (US); Robert J. Contolini, Lake Oswego, OR (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/258,917

(22) Filed: Mar. 1, 1999

(51) Int. Cl.$^7$ .................................................. H01L 21/311
(52) U.S. Cl. .......................... 438/694; 438/705; 438/738
(58) Field of Search ..................................... 438/689, 694, 438/712, 725, 742, 754, 705, 738, 749, 751, 975; 313/309, 310, 336, 351, 445

(56) References Cited

U.S. PATENT DOCUMENTS

| | | | |
|---|---|---|---|
| 4,274,935 | * 6/1981 | Schmelzer et al. | 204/192 |
| 4,559,096 | * 12/1985 | Friedman et al. | 156/272.2 |
| 4,713,260 | * 12/1987 | Roberts et al. | 437/238 |
| 4,732,646 | * 3/1988 | Elsner et al. | 156/626 |
| 5,356,511 | * 10/1994 | Hoessel et al. | 156/629 |
| 5,665,421 | * 9/1997 | Bergeron et al. | 427/64 |
| 5,801,477 | * 9/1998 | Macaulay | 313/309 |

* cited by examiner

Primary Examiner—David Nelms
Assistant Examiner—Phuc T. Dang
(74) Attorney, Agent, or Firm—L. E. Carnahan; Alan H. Thompson

(57) ABSTRACT

A method for forming nuclear tracks having a width on the order of 100–200 nm in nuclear trackable materials, such as polycarbonate (LEXAN) without causing delamination of the LEXAN. The method utilizes an adhesion film having a inert oxide which allows the track to be sufficiently widened to >200 nm without delamination of the nuclear trackable materials. The adhesion film may be composed of a metal such as Cr, Ni, Au, Pt, or Ti, or composed of a dielectric having a stable surface, such as silicon dioxide ($SiO_2$), silicon nitride ($SiN_x$), and aluminum oxide (AlO). The adhesion film can either be deposited on top of the gate metal layer, or if the properties of the adhesion film are adequate, it can be used as the gate layer. Deposition of the adhesion film is achieved by standard techniques, such as sputtering or evaporation.

4 Claims, 1 Drawing Sheet

ADHESION LAYER FOR ETCHING OF TRACKS IN NUCLEAR TRACKABLE MATERIALS

The United States Government has rights in this invention pursuant to Contract No. W-7405-ENG48 between the United States Department of Energy and the University of California for the operation of Lawrence Livermore National Laboratory.

BACKGROUND OF THE INVENTION

The present invention relates to the fabrication of integrated circuits, particularly to the formation of nuclear tracks in a patterned mask layer, and more particularly to the formation of wide tracks (100–200 nm) in nuclear trackable material without causing delamination of the material.

The formation of holes, openings, or passages in dielectric materials has involved directing high-energy charged particles onto the material thereby forming latent nuclear tracks in the dielectric material, followed by etching. The passage of an atomic particle through a dielectric material can result in the creation of a latent nuclear track that extends along a straight line corresponding to the path of the atomic particle. This latent track has a diameter of 5–30 nm with bonding and density different from the non-tracked regions. Various methods for forming tracks in nuclear trackable materials have been developed, as exemplified by U.S. application Ser. No. 08/851,258 filed May 5, 1997, entitled "Vapor Etching of Nuclear Tracks in Dielectric Materials", and U.S. application Ser. No. 08/847,085 filed May 1, 1997, entitled "Use of a Hard Mask for Formation of Gate Dieclectric Via Nanofilament Field Emission Devices", each assigned to the same assignee.

Nuclear tracks can be selectively etched in Nuclear trackable materials, such as polycarbonate, exemplified by LEXAN, made by the General Electric Company. In the case of LEXAN, the track is etched with high selectivity, having diameters as small as 30 nm. In order to etch the track wider, on the order of 100–200 nm, which is desirable for field emitter gate structures, the etch becomes nonselective, and the film is eroded away as the track widens. In order to etch the nuclear track wider, an etch is necessary which will not attack the interface between the LEXAN and the gate metal, so as to prevent delamination of the LEXAN film.

Nuclear tracks in LEXAN are conventionally etched using a KOH or NaOH chemistry. These solutions will also readily etch many metal oxides, including Mo-oxide and W-oxide, which form on the surface of metal exposed to air. As a result, the LEXAN-metal interface is etched somewhat selectively, with the result being delamination of the LEXAN film prior to etching to the required diameter.

The present invention provides a solution to widening the tracks in dielectric materials, particularly LEXAN, to >200 nm without delamination of the film. The invention utilizes an adhesion film which allows the track to be sufficiently widened. The adhesion film is composed of a metal having an inert oxide, or a dielectric having a stable surface. The adhesion film is deposited on top of the gate metal layer or film, or if the properties of the gate metal layer are adequate (have an inert oxide) the gate metal will function as to adhesion film to enable the tracks to be etched to the required diameter without delamination problems.

SUMMARY OF THE INVENTION

It is an object of the present invention to enable widening of tracks in nuclear trackable materials without causing delamination of the materials.

A further object of the invention is to provide a method for forming 100–200 nm openings in polycarbonate materials without causing delamination of the materials.

A further object of the invention is to enable selective etching of a nuclear trackable material to widths of >200 nm without an etchant attack of the interface between the material and an adjacent metal layer.

Another object of the invention is to provide a method for selective etching of nuclear trackable material using an adhesion layer composed of a metal having an inert oxide or a dielectric having a stable surface.

Another object of the invention is to utilize an adhesion film intermediate a nuclear trackable material and a gate metal, which allows tracks in the material to be sufficiently widened to >200 nm without delamination of the material at the interface with the gate metal.

Another object of the invention is to enable widening of tracks in nuclear trackable material without delamination of the material, by utilizing an adhesion film intermediate the material and a metal layer or forming the metal layer of a metal having an oxide inert to an etchant used to widen the tracks.

Other objects and advantages of the present invention will become apparent from the following description and accompanying drawings. The present invention involves preventing delamination of nuclearly trackable material deposited on a metal during etching to widen tracks in the material. The invention involves a method to enable etching of nuclear tracks in polycarbonate and other nuclear trackable materials without delamination of the materials at the interface with a metal layer.

The invention utilizes an adhesion layer intermediate the metal layer and the nuclear trackable materials, or the use of a metal in the metal layer which has an inert oxide to the etchant being used to widen tracks in the materials. The adhesion layer may be composed of a metal having an inert oxide or a dielectric having a stable surface not effected by the etchant used to widen the tracks in the nuclear trackable material.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

The present invention is directed to a method for preventing delamination of a nuclear trackable material, such as LEXAN (a polycarbonate, when tracks in the LEXAN are widened to the range of 100–200 nm. As pointed out above, when nuclear trackable materials, particularly LEXAN, are etched to widen the tracks to a diameter greater than about 30 nm, the etchant will generally attach the interface between the LEXAN and the adjoining metal layer, such as a gate metal layer, causing delamination of the LEXAN. The delamination problem is solved by the present invention by the use of an adhesion layer or a metal layer having an oxide inert to the etchant used to widen the tracks in the LEXAN. For example, by the use of a metal layer having an inert oxide, such as Cr, Au, Ni, Pt, and Ti, or a dialectric layer having a stable surface, such as silicon dioxide, silicon nitride, and aluminum oxide, the tracks in the LEXAN can be etched to the required diameter without delamination problems. The adhesion film can either be deposited on top of the gate metal film, or if the properties are adequate, the adhesion layer can become the gate layer. Deposition is achieved by standard techniques, such as sputtering or evaporation. In some applications, patterning of the adhesion layer is done after the LEXAN and gate formation process steps.

FIGS. 1–4 illustrate various embodiments for enabling the widening of tracks in nuclear trackable materials, particularly LEXAN, without the delamination problems discussed above.

Figure 1:
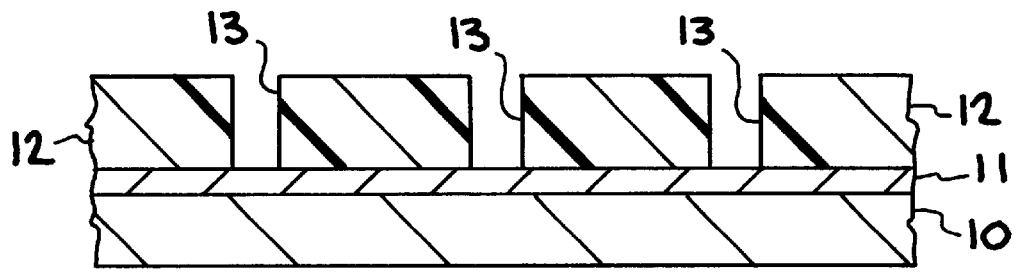
FIG. 1 is a cross-sectional view of an embodiment utilizing an adhesion layer for widening tracks in nuclear trackable material in accordance with the present invention.

FIG. 1 illustrates an embodiment having a gate metal layer 10, and adhesion layer 11, and a layer 12 of nuclear trackable material, such as LEXAN, having a plurality of tracks 13 therein which have been widened to the 100–200 nm range.

As seen in FIG. 1, there is no delamination of the LEXAN 12 at the bottom of the tracks 13. By way of example, the gate material layer 10 may be composed of Mo, Ni or Al, and the adhesion layer 11 may be composed of any metal not attacked by the track etchant, such as Cr, with a thickness in the range of 100 Å to 2000 Å. The openings 13 in LEXAN layer 12 may be etched by submerging in a bath of KOH (6M concentration) at temperatures from 21° C.–40° C., or higher, for a period of 1–20 minutes.

Figure 2:
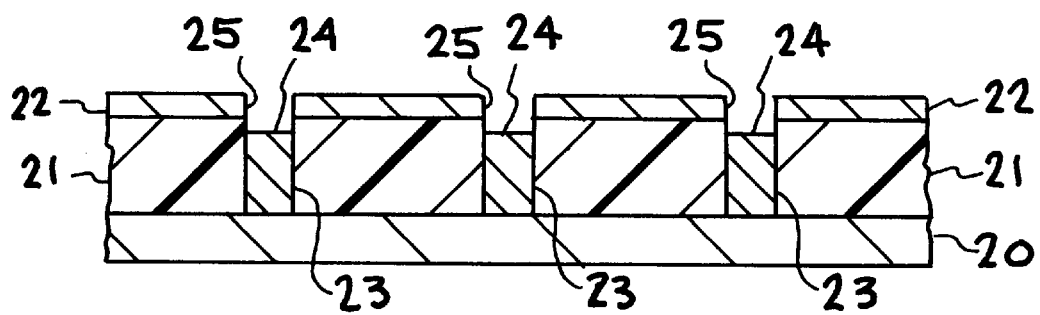
FIG. 2 is a cross-sectional view of another embodiment utilizing a base metal layer which has an oxide inert to the LEXAN etching solution, and with a gate metal deposited after the nanofilament has been deposited in openings in the LEXAN.

FIG. 2 illustrates an embodiment comprising a substrate 20 composed of a metal having an inert oxide, a layer 21 of LEXAN, and a layer 22 of gate metal, with the LEXAN layer 21 having a plurality of widened openings 23 (>200 nm) in which are deposited nanofilaments 24 as by electroplating, and the gate metal layer 22 is provided with openings.

Note that the nanofilaments 24 are spaced from the gate metal layer 22, 25 aligned with openings 23. In this embodiment, the gate metal layer 22 is deposited after the nanofilaments 24 have been formed and the power pressure of the gate metal deposition is varied to prevent coating the nanofilaments 24 and thus prevent shorting between the gate metal layer 22 and the nanofilaments.

By way of example to the inert oxide metal of substrate 20 may be composed of NI, Al or Cr/SiO$_2$; the nanofilaments 24 may be composed of Ni, Pt or Mo; the gate metal layer 22 may be composed of Mo, Cr or Ni, having a thickness of 400 Å to 2000 Å; and the openings 23 in LEXAN layer 21 may be formed by etching of nuclear tracks in a heated bath (21°–35° C.) of 6M concentration KOH for 1–20 minutes.

Figure 3:
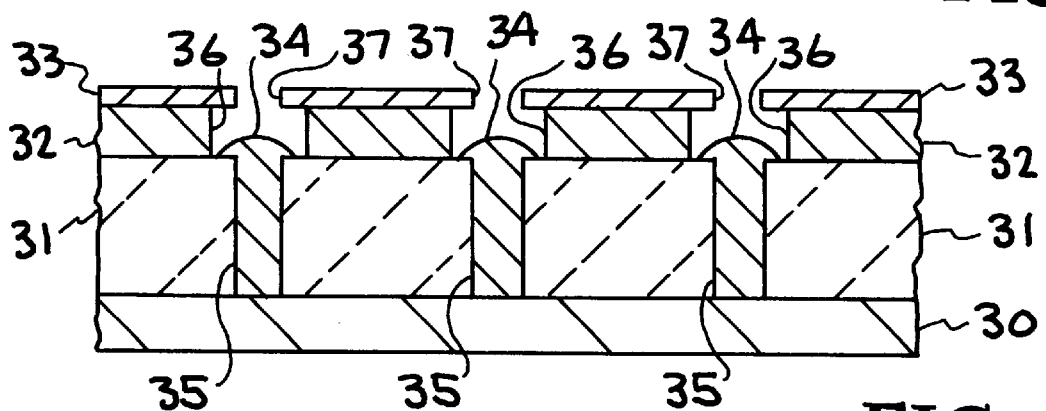
FIG. 3 is a cross-sectional view wherein the adhesion layer is deposited on top of the gate metal layer.

FIG. 3 illustrates an embodiment, wherein a nanofilament is deposited in openings in a dielectric with the gate metal deposited on the dielectric with an adhesion layer located on the gate metal. As pointed out above, certain dielectrics, such as SiO$_2$ have stable surfaces and thus do not have the delamination problem of LEXAN.

As shown in FIG. 3, the embodiment comprises a substrate 30 on which a layer 31 of SiO$_2$, a gate metal layer 32 of Mo, and an adhesion layer 33 of Cr, which is removed after the etching process and the formation of nanofilaments 34 in openings 35 of the SiO$_2$ layer 31. As described above, Cr-oxide and SiO$_2$ are inert relative to Mo-oxide and thus openings 36 in gate metal layer 32 can be widened compared to openings 35 in SiO$_2$ layer 31 and openings 37 in adhesion layer 33. Note in this embodiment, the nanofilaments 34 are overplated (extend above the SiO$_2$ layer 31) and thereafter can be etched to form pointed nanofilaments, as known in the art. In this embodiment the nanofilaments 34 are deposited after the openings 36 in gate metal layer 32 have been widened. After the formation of the nanofilaments 34, the adhesion layer 33 is stripped (removed), as by selective wet chemical etchants or plasma etching techniques as known in the art. By way of example, the Mo layer 32 may have a thickness of 400 Å to 2000 Å with openings 36 therein having a diameter of 1000 Å to 3000 Å; with the Cr adhesion layer 33 having a thickness of 100 Å to 400 Å. By way of example the openings 35 in SiO$_2$ layer 31 may be formed by plasma etching; and the openings 36 in Mo layer 31 may be formed by plasma etching techniques using the holes etched in the LEXAN as a mask to pattern both the adhesion and gate layers. Here, as in the FIG. 1 embodiment, a layer of LEXAN is deposited, then irradiated, after which a selective etch of the nuclear tracks is performed by etching in heated (21°–35° C.) 6 M concentation KOH for 1–20 minutes.

Figure 4:
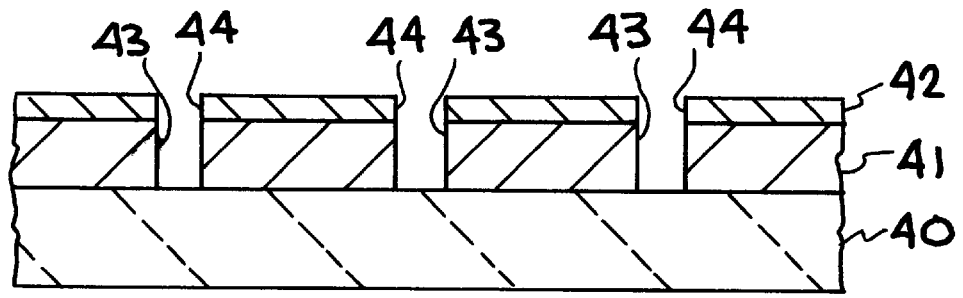
FIG. 4 illustrates in cross-section an embodiment wherein an adhesion layer of Cr, for example, is deposited on a layer of Mo, for example, which is deposited on a layer of dielectric material, such as $SiO_2$ and the adhesion layer functions as a pattern transfer film.

FIG. 4 illustrates an embodiment composed of a layer 40 of SiO$_2$, a gate layer 41 of Mo, and an adhesion layer 42 of Cr. Here, openings 43 and 44 are formed in layers 41 and 42, respectively, with no widening of the openings 43 in the Mo layer adjacent the SiO$_2$ layer 40 or the Cr layer 42, since as pointed out above, both Cr and SiO$_2$ are not affected by the conventional etchant for Mo. Here, the openings 44 in Cr layer 42 are formed to a desired width of the openings 43 in Mo layer 41, whereafter the Mo is etched by selective plasma etching using SF$_6$ gases.

It has thus been shown that the present invention overcomes the delamination problem associated with widening tracks beyond about 30 nm in nuclear trackable material, particularly polycarbonates, such as LEXAN. The ion trackable material may be composed of ion trackable polymers, ion trackable inorganic dielectrics, and ion trackable photoresists. By the use of an adhesion layer having an inert oxide or a dielectric having a stable surface, tracks in ion trackable materials, particularly LEXAN, can be widened to the 100–200 nm range without delamination of the LEXAN. Also, by use of a gate metal having an inert oxide, tracks in LEXAN can be successfully widened to >200 nm.

While particular embodiments, materials, and parameters have been set forth to exemplify and teach the principles of the invention, such are not intended to be limiting. Modifications and changes may become apparent to those skilled in the art and it is intended that the invention be limited only by the scope of the appended claims.

What is claimed is:

1. A method for preventing delamination of nuclear trackable material during selective etching of tracks therein having a width greater than 30 nm, comprising:

depositing a material adjacent the nuclear trackable material which is inert to etchant utilized in widening at least one track in the nuclear trackable material, and selectively etching the at least one track to a width of up to 100–200 nm, depositing the material being carried out using a metal having an oxide inert to an etchant utilized in widening the at least one track.

2. The method of claim 1 (3) wherein said metal is selected from the group consisting of CR, Au, Ni, Ti and Pt.

3. The method of claim 1, wherein said nuclear trackable material is selected from a group consisting of ion trackable polymers, ion trackable inorganic dielectrics, and ion trackable photoresists.

4. The method of claim 1, wherein said nuclear trackable material is composed of polycarbonate.

\* \* \* \* \*